United States Patent
Wu et al.

(10) Patent No.: US 8,166,424 B2
(45) Date of Patent: Apr. 24, 2012

(54) METHOD FOR CONSTRUCTING OPC MODEL

(75) Inventors: Te-Hung Wu, Tainan County (TW); Chuen-Huei Yang, Taipei (TW)

(73) Assignee: United Microelectronics Corp., Science-Based Industrial Park, Hsinchu (TW)

(*) Notice: Subject to any disclaimer, the term of this patent is extended or adjusted under 35 U.S.C. 154(b) by 528 days.

(21) Appl. No.: 12/211,657

(22) Filed: Sep. 16, 2008

(65) Prior Publication Data
US 2010/0070944 A1 Mar. 18, 2010

(51) Int. Cl.
G06F 17/50 (2006.01)
(52) U.S. Cl. .................. 716/53; 716/51; 716/55
(58) Field of Classification Search .......... 716/51, 716/53, 55
See application file for complete search history.

(56) References Cited

U.S. PATENT DOCUMENTS

| | | | |
|---|---|---|---|
| 2003/0192015 A1* | 10/2003 | Liu | 716/4 |
| 2006/0273242 A1* | 12/2006 | Hunsche et al. | 250/208.1 |
| 2008/0145769 A1* | 6/2008 | Kawakami | 430/5 |
| 2008/0232671 A1* | 9/2008 | Asano et al. | 382/144 |
| 2009/0119635 A1* | 5/2009 | Takahata | 716/20 |

OTHER PUBLICATIONS

Te-Hung Wu et al.,"Method for constructing opc model", Invention disclosure, Jan. 2, 2008, p. 1.

* cited by examiner

*Primary Examiner* — Stacy Whitmore
*Assistant Examiner* — Magid Dimyan
(74) *Attorney, Agent, or Firm* — Winston Hsu; Scott Margo

(57) ABSTRACT

A method for constructing an optical proximity correction (OPC) model is described. A test pattern is provided, and the test pattern is then written on a mask. The pattern on the mask is measured to obtain a modified pattern. An OPC model is constructed according to the modified pattern.

12 Claims, 1 Drawing Sheet

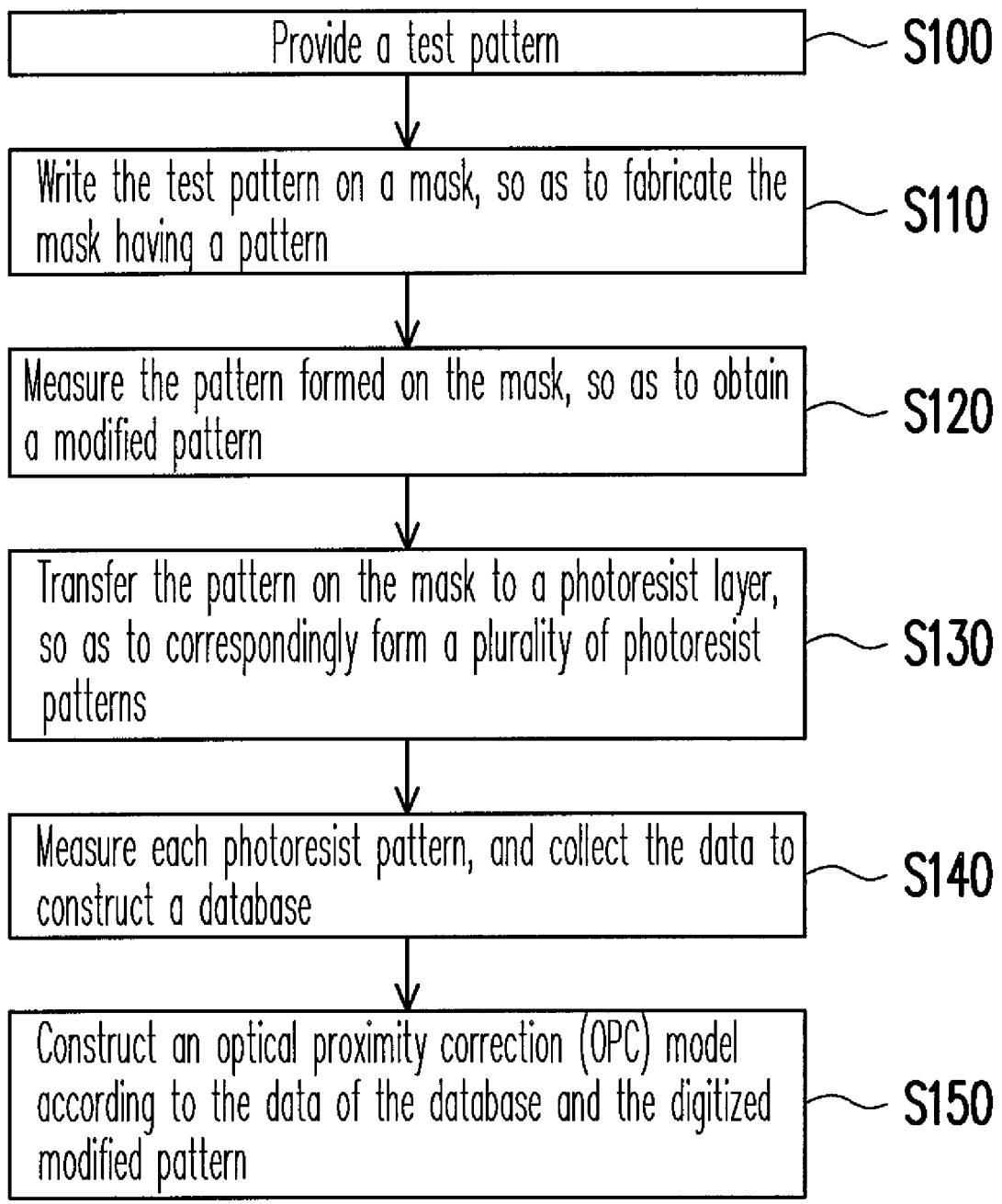

METHOD FOR CONSTRUCTING OPC MODEL

BACKGROUND OF THE INVENTION

1. Field of the Invention

The present invention generally relates to a lithography process, and in particular, to a method for constructing an optical proximity correction (OPC) model.

2. Description of Related Art

Along with the rapid development of semiconductor process technique, further improvement in operation speed and performance of the device is demanded, which needs continuously miniaturizing the size of the whole circuit device and continuously increasing the integration thereof. Usually, as the semiconductor devices develop towards the design of the compact circuit devices, the lithography process is quite important in the whole process.

In the semiconductor process, for the patterning of each film or areas with implanted dopant, the scope thereof is defined and the critical dimension (CD) is determined by the lithography process. In the lithography process, firstly a photosensitive photoresist material layer is formed on a wafer surface. Then, a photoresist exposure procedure and a development procedure are performed in sequence, so as to transfer the wanted pattern to the photoresist material layer on the wafer surface via the pattern of the mask, thereby forming a wanted photoresist pattern. As the devices are continuously miniaturized and integrated, the design of the integrated circuit (IC) becomes increasingly complicated, such that the accuracy of transferring the mask pattern to the wafer is quite important. If the transferring of the pattern does not meet the expectations, the CD on the chip may be impacted.

Under the trend that the line width and the pitch of the device are reduced, the transferring of the pattern may be easily deviated in the exposure procedure, that is, the so-called optical proximity effect (OPE). The accuracy of the lithography imaging may directly affect the yield of the product, and some methods of enhancing the resolution are continuously proposed to solve the foregoing problems. For example, the mask pattern is modified by using the optical proximity correction (OPC), and the main object thereof is to eliminate the CD deviation resulting from the OPE, that is, to reduce the deviation between the photoresist pattern and the mask pattern.

In a conventional OPC, a deviation value is obtained by comparing the original design data having a circuit layout pattern with the photoresist pattern formed by pattern transferring through the mask, and the relative data of different patterns are collected, so as to construct an OPC model. However, in the process of fabricating the mask, when the original design pattern is written on the mask, usually the pattern formed on the mask may have corner rounding because of the natural characteristics of the writing tool, and thus the pattern formed on the mask may not be identical to the original design pattern. Therefore, the OPC model constructed according to the original design pattern cannot modify the device layout design with the deviation caused by the pattern actually formed on the mask.

SUMMARY OF THE INVENTION

Accordingly, the present invention is directed to a method for constructing an optical proximity correction (OPC) model, which facilitates the pattern transferring.

The present invention provides a method for constructing an OPC model. A test pattern is provided, and the test pattern is then written on a mask. The pattern formed on the mask is measured to obtain a modified pattern. An OPC model is constructed according to the modified pattern.

In an embodiment of the present invention, a method of obtaining the modified pattern is delineating a profile of the pattern on the mask by simulation.

In an embodiment of the present invention, the method of obtaining the modified pattern is using an image obtained by a scanning electron microscope (SEM).

In an embodiment of the present invention, the step of constructing the OPC model further includes inputting a physical parameter, for example, a numerical aperture (NA), a sigma, an illuminator shape, or film stack properties.

In an embodiment of the present invention, the step of constructing the OPC model further includes inputting a statistical parameter, for example, a pattern density or an aerial image slope.

In an embodiment of the present invention, after obtaining the modified pattern and before constructing the OPC model, the method further includes transferring the pattern on the mask to a photoresist layer so as to correspondingly form a plurality of photoresist patterns, measuring and collecting data of each of the photoresist patterns so as to construct a database, and constructing the OPC model according to the modified pattern and the data of the database.

In an embodiment of the present invention, the method further includes correcting the test pattern according to the OPC model.

In an embodiment of the present invention, the method further includes converting the modified pattern to a digitized format.

In an embodiment of the present invention, the test pattern is an original design data.

In the method of the present invention, the pattern profile actually formed on the mask, that is, the modified pattern, may be obtained by the existing equipment, and the OPC model is constructed by the existing software package according to the modified pattern, so as to enhance the reliability of the lithography process and to save the processing cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a flow chart of a method for constructing an OPC model according an embodiment of the present invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

During the process of fabricating a mask, the pattern formed on the mask may be different from the originally-designed drawing pattern. Accordingly, in the present invention, when the correction model of the mask pattern is constructed, the process error of forming the mask pattern and the influence of the OPE on the device layout pattern actually formed on the wafer are taken into consideration at the same time. After finishing the fabrication of the mask, an optical proximity correction (OPC) model to be subsequently constructed is appropriately modified with the variation possibly resulted in the mask fabrication process, so as to effectively increase the authenticity of the lithography process.

In a method for constructing the OPC model according to an embodiment of the present invention, a digitized modified pattern is obtained according to a mask pattern actually formed on the mask, all the parameter conditions, such as physical parameters and statistical parameters, in the process are added, and a database including the data practically collected from a photoresist layer of a wafer is used, so as to construct the OPC model, thereby modifying the originally-designed layout pattern according to the OPC model. The implementation of the present invention is further described in a manner of a flow chart hereinafter. FIG. 1 is a flow chart of a method for constructing the OPC model to correct the mask pattern according to an embodiment of the present invention.

Referring to FIG. 1, in step S100, a test pattern is provided. The test pattern is a drawing data of the originally-designed circuit layout pattern, and, for example, describes the geometric pattern of the IC layout to be transferred onto the wafer. In an embodiment, the test pattern includes data of the geometrical pattern, such as various critical dimensions (CDs), various pattern densities, various line widths, and various pitches.

Next, in step S110, the test pattern is written on a mask, so as to fabricate the mask having the mask pattern. The method of writing the test pattern on the mask is, for example, performing a writing step, and the writing step is performed by the use of an electronic beam or a laser beam.

In step S120, the pattern formed on the mask is measured, so as to obtain a modified pattern. In detail, being affected by the processing equipment during the writing step in the fabrication of the mask, the pattern actually formed on the mask may not be identical to the test pattern originally to be written. That is to say, the pattern formed on the mask may be different from the originally-designed test pattern, so it is necessary to obtain the real mask pattern, that is, the modified pattern, by measuring the mask. The method of obtaining the modified pattern is, for example, delineating the profile, the CD, and other properties of the pattern formed on the mask by simulation or by the use of an image obtained through an SEM. After obtaining the modified pattern, the modified pattern may be further converted to a digitized data file, for subsequently constructing the OPC model. In an embodiment, the format of the digitized data file is not particularly limited, and includes the information about the profile, the CD, and other data of the pattern formed on the mask.

Then, in step S130, the pattern on the mask is transferred to a photoresist layer, so as to correspondingly form a plurality of photoresist patterns in the photoresist layer. The method of transferring the pattern on the mask to the photoresist layer is, for example, performing an exposure step and a development step in sequence, which are well-known to those skilled in the art, and thus will not described herein.

In step S140, each photoresist pattern formed in step S130 is measured, and the data is collected to construct a database. The method of measuring the photoresist pattern and collecting the data is, for example, measuring the CD of each photoresist pattern by using the SEM. Usually, when the pattern on the mask is transferred to the photoresist layer through the exposure and the development steps, the formed photoresist patterns may have deviation problems, such as corner rounding or changes in line width, arising from interference of the light source used in the exposure step and influence of the photoresist material in the photoresist layer, that is, the optical proximity effect (OPE). Therefore, the formed photoresist patterns may not be identical to the pattern on the mask. The method of constructing the database is, for example, calculating the deviation value between the measured result of each photoresist pattern and the corresponding modified pattern, collecting deviation values between the photoresist patterns and the modified patterns of various different designed patterns, and then storing all relative data to construct a database.

In step S150, an OPC model is constructed according to the data of the database and the digitized modified pattern. The construction of the OPC model is carried out by using the existing software package, into which the data of the database are inputted, calculated and then modified to generate the model. In an embodiment, the step of constructing the OPC model further includes inputting a physical parameter and a statistical parameter into the software package. The physical parameter includes a numerical aperture (NA), a sigma, an illuminator shape, or film stack properties. The statistical parameter includes a pattern density or an aerial image slope.

It should be noted that in the above steps, the OPC model is constructed by comparing the modified pattern obtained from the real pattern formed on the mask with the photoresist patterns formed by performing the lithography process using the mask. Therefore, the OPE resulting from the exposure step may be effectively eliminated, and thus the deviation between the mask pattern and the photoresist patterns can be significantly reduced.

Then, the arrangement of the originally-designed test pattern may be further corrected by using the OPC model constructed in the above method, and the corrected pattern data are subsequently processed, such that the device patterns formed on the photoresist layer can much satisfy the expected patterns. Those skilled in the art may know the subsequent application well, so the detail description is omitted herein.

To sum up, in the method for constructing the OPC model of the present invention, the modified pattern from the real mask pattern formed on the mask is obtained by simulation or by the SEM image, such that the OPC model is constructed according to the modified pattern. Therefore, the OPC model constructed according to the method of the present invention is mainly aimed at the real pattern formed on the mask, such that the photoresist pattern formed on the photoresist layer is more conform to the expected pattern, thereby effectively increasing the reliability and the yield of the lithography process.

In addition, in the method of the present invention, the modified pattern obtained from the mask and the construction of the OPC model are achieved by the existing equipment and the software package without any complicated operation and deduction. Thus, the operation time of constructing the OPC model is reduced as the authenticity of the lithography process is enhanced, thereby saving the process cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for constructing an optical proximity correction (OPC) model, comprising:
   providing a test pattern;
   writing the test pattern on a mask to form a pattern formed on the mask, wherein said pattern formed on the mask is different from the test pattern;

measuring said pattern formed on the mask, so as to obtain a modified pattern by using an image obtained by a scanning electron microscope (SEM); and constructing an OPC model by inputting a physical parameter comprising a numerical aperture (NA), a sigma, an illuminator shape, or film stack properties and by inputting a statistical parameter comprising a pattern density or an aerial image slope according to the modified pattern.

2. The method for constructing an OPC model according to claim 1, after obtaining the modified pattern and before constructing the OPC model, further comprising:

transferring the pattern on the mask to a photoresist layer, so as to correspondingly form a plurality of photoresist patterns; and measuring each of the photoresist patterns, and collecting data of the photoresist patterns, so as to construct a database.

3. The method for constructing an OPC model according to claim 2, further comprising constructing the OPC model according to the modified pattern and the database.

4. The method for constructing an OPC model according to claim 1, further comprising correcting the test pattern according to the OPC model.

5. The method for constructing an OPC model according to claim 1, further comprising converting the modified pattern to a digitized format.

6. The method for constructing an OPC model according to claim 1, wherein the test pattern is an original design data.

7. A method for constructing an optical proximity correction (OPC) model, comprising:

providing a test pattern;

writing the test pattern on a mask to form a pattern formed on the mask;

obtaining a modified pattern by delineating a profile of the pattern formed on the mask by simulation; and constructing an OPC model by inputting a physical parameter comprising a numerical aperture (NA), a sigma, an illuminator shape, or film stack properties and by inputting a statistical parameter comprising a pattern density or an aerial image slope according to the modified pattern.

8. The method for constructing an OPC model according to claim 7, after obtaining the modified pattern and before constructing the OPC model, further comprising:

transferring the pattern on the mask to a photoresist layer, so as to correspondingly form a plurality of photoresist patterns; and measuring each of the photoresist patterns, and collecting data of the photoresist patterns, so as to construct a database.

9. The method for constructing an OPC model according to claim 8, further comprising constructing the OPC model according to the modified pattern and the database.

10. The method for constructing an OPC model according to claim 7, further comprising correcting the test pattern according to the OPC model.

11. The method for constructing an OPC model according to claim 7, further comprising converting the modified pattern to a digitized format.

12. The method for constructing an OPC model according to claim 7, wherein the test pattern is an original design data.

* * * * *